(12) United States Patent
Lin (10) Patent No.: US 7,902,833 B2
(45) Date of Patent: Mar. 8, 2011

(54) MALFUNCTION DETECTING CIRCUIT AND MALFUNCTION DETECTING METHOD FOR DETECTING MALFUNCTION OF CURRENT-SENSING RESISTOR, AND POWER CONVERTING SYSTEM APPLYING THE MALFUNCTION DETECTING CIRCUIT

(75) Inventor: Chun-Liang Lin, Hsin-Chu (TW)

(73) Assignee: Leadtrend Technology Corp., Science-Based Industrial Park, Hsin-Chu (TW)

( * ) Notice: Subject to any disclaimer, the term of this patent is extended or adjusted under 35 U.S.C. 154(b) by 249 days.

(21) Appl. No.: 12/260,076

(22) Filed: Oct. 28, 2008

(65) Prior Publication Data

US 2009/0212787 A1 Aug. 27, 2009

(30) Foreign Application Priority Data

Feb. 26, 2008 (TW) .............................. 97106610 A (51) Int. Cl.
*G01R 31/02* (2006.01)

(52) U.S. Cl. ......................................... 324/549; 324/522
(58) Field of Classification Search .................. 324/522, 324/547, 549
See application file for complete search history.

(56) References Cited

U.S. PATENT DOCUMENTS

2007/0127170 A1* 6/2007 Park ................................ 361/18

* cited by examiner

*Primary Examiner* — Vincent Q Nguyen
(74) *Attorney, Agent, or Firm* — Winston Hsu; Scott Margo (57) ABSTRACT

A malfunction detecting circuit for detecting malfunction of a current sensing resistor includes a reference-voltage generating circuit and a comparing circuit, wherein the reference-voltage generating circuit is utilized to generate a reference voltage signal varying with the on time period of a power switch of a power converting system. The comparing circuit compares a sensing voltage signal corresponding to a current flowing through the current sensing resistor with the reference voltage signal to generate a comparing result indicating whether the malfunction occurs.

20 Claims, 6 Drawing Sheets

MALFUNCTION DETECTING CIRCUIT AND MALFUNCTION DETECTING METHOD FOR DETECTING MALFUNCTION OF CURRENT-SENSING RESISTOR, AND POWER CONVERTING SYSTEM APPLYING THE MALFUNCTION DETECTING CIRCUIT

BACKGROUND OF THE INVENTION

1. Field of the Invention

The present invention relates to a malfunction detecting circuit implemented in a power converting system and a detecting method thereof, and more particularly, to a malfunction detecting circuit for detecting malfunction of a current sensing resistor in a power converting system, and a detecting method thereof.

2. Description of the Prior Art

Figure 1:
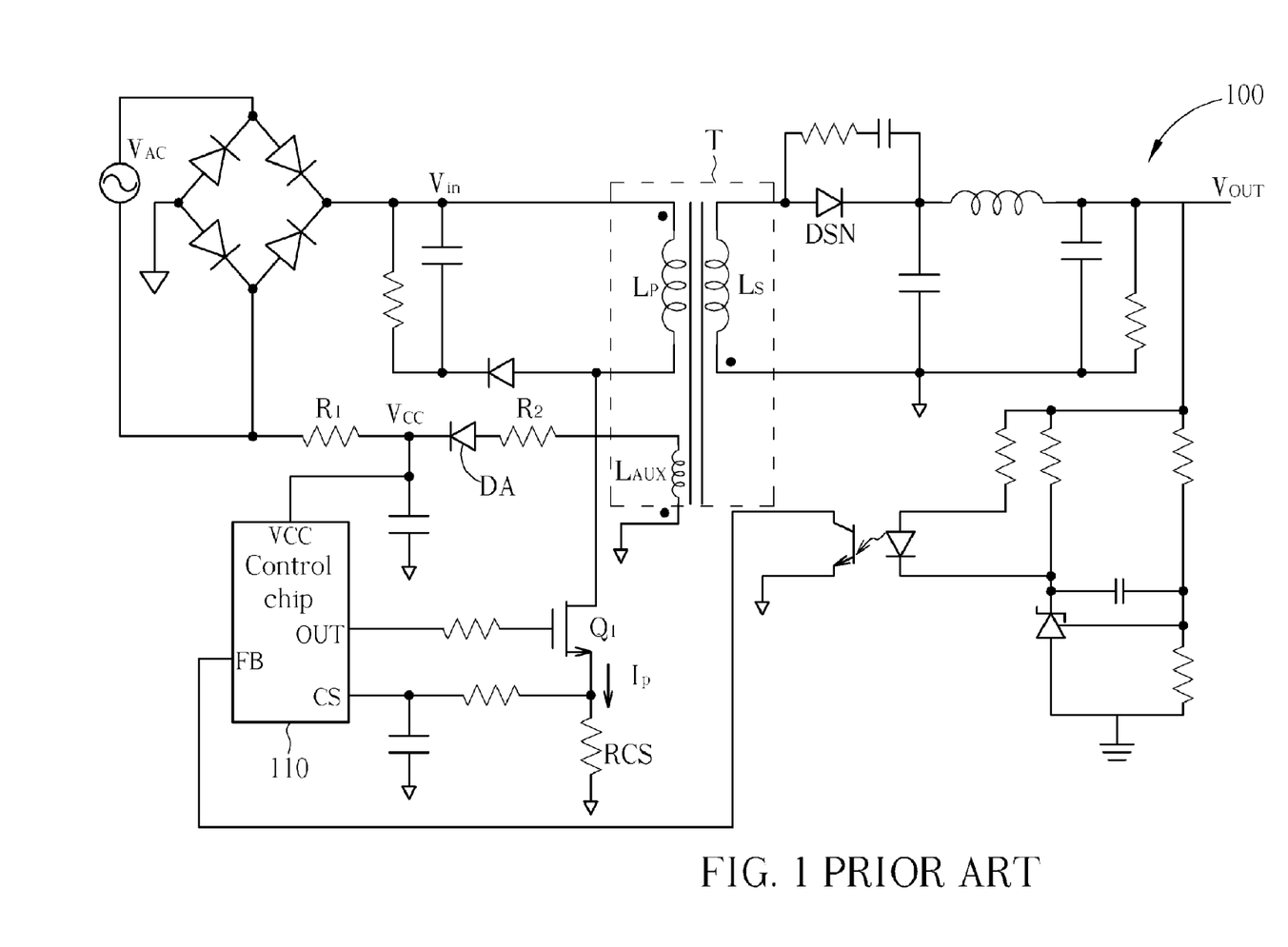
FIG. 1 is a diagram of a conventional fly-back power converter.

FIG. 1 is a diagram of a conventional fly-back power converter 100. When the power switch $Q_1$ of the fly-back power converter 100 is turned on, the energy from the rectified DC input voltage $V_{in}$ is stored in the primary winding $L_P$ of the transformer T. The stored energy is then passed to the secondary winding $L_S$ to form the output voltage $V_{OUT}$ when the power switch $Q_1$ is turned off. The conducting of power switch $Q_1$ is controlled by a pulse width modulation (PWM) signal outputted by the PWM control chip 110, which adjusts the duty cycle of the PWM signal in order to generate the desired output voltage $V_{OUT}$.

Sometimes malfunction, such as mechanical breakdown, improper operation, or any other accident, occurs and renders the resistance of the current sensing resistor Rcs almost zero, accidentally short the source pin of power switch Q1 to ground. Thus, the current sensing pin CS can no longer detect the over current situation of the primary winding current $I_P$, and the control chip 110 may conduct the power switch $Q_1$ at the maximum duty cycle, resulting in an unexpectedly-increasing output voltage $V_{OUT}$, which may adversely affect the operation of the fly-back power converter 100. One solution to the detection of the malfunction is to detect the Vcc voltage provided by the auxiliary winding $L_{AUX}$ of the transformer T, and to determine if the output voltage $V_{OUT}$ is too high according to the detecting result. When the control chip 110 detects that the Vcc voltage is higher than a predefined over voltage protection threshold, it determines the output voltage $V_{OUT}$ is too high, and an over voltage protection mechanism should be activated.

In practice, the predefined over voltage protection threshold is much higher than the voltage of Vcc under normal operation, however. It will be complex and difficult to design the coil ratio of the primary winding $L_P$ to the auxiliary winding $L_{AUX}$ while giving consideration to both normal operation and over voltage protection. Moreover, when the output voltage $V_{OUT}$ initially increases from zero voltage level, the Vcc voltage has already been away from zero voltage level since it obtains part of its power directly from the input AC voltage $V_{AC}$ through a resistor $R_1$. Hence, when the primary winding $L_P$ is suddenly stopped conducting current, the diode DSN at the secondary side becomes conductive earlier than the diode DA at the auxiliary side, causing that the secondary winding $L_S$ obtains power stored in the primary winding $L_P$ earlier than the auxiliary winding $L_{AUX}$ does. As a result, it may be deemed late to enable the over voltage protection only when Vcc voltage is detected to be higher than the predefined over voltage protection threshold, because the output voltage $V_{OUT}$ may be too high and cause damage to the circuits coupled to the output end of the fly-back power converter 100.

SUMMARY OF THE INVENTION

According to one exemplary embodiment of the present invention, a malfunction detecting circuit utilized to detect malfunction occurring to a current sensing resistor is disclosed. The malfunction detecting circuit comprises a reference-voltage generating circuit and a comparing circuit. The reference-voltage generating circuit generates a reference voltage signal varying with an on time period of a power switch, and the comparing circuit compares a sensing voltage signal with the reference voltage signal to generate a comparing result which indicates whether the malfunction occurs. The sensing voltage signal corresponds to a current flowing through the current sensing resistor.

According to another exemplary embodiment of the present invention, a power converting system is disclosed. The power converting system comprises a transformer having a primary winding, and a malfunction detecting circuit for detecting malfunction occurring to a current sensing resistor. The primary winding of the transformer is coupled to a power switch. The current sensing resistor is for sensing the current flowing through the primary winding. The malfunction detecting circuit comprises a reference-voltage generating circuit and a comparing circuit. The reference-voltage generating circuit generates a reference voltage signal varying with an on time period of the power switch. The comparing circuit compares a sensing voltage signal corresponding to a current flowing through the current sensing resistor with the reference voltage signal, to generate a comparing result indicating whether the malfunction occurs.

According to another exemplary embodiment of the present invention, a malfunction detecting method for detecting malfunction occurring to a current sensing resistor is disclosed. The method comprises generating a reference voltage signal varying with an on time period of a power switch, comparing a sensing voltage signal with the reference voltage signal in order to generate a comparing result, and determining whether the malfunction occurs according to the comparing result, wherein the sensing voltage signal corresponds to a current flowing through the current sensing resistor.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
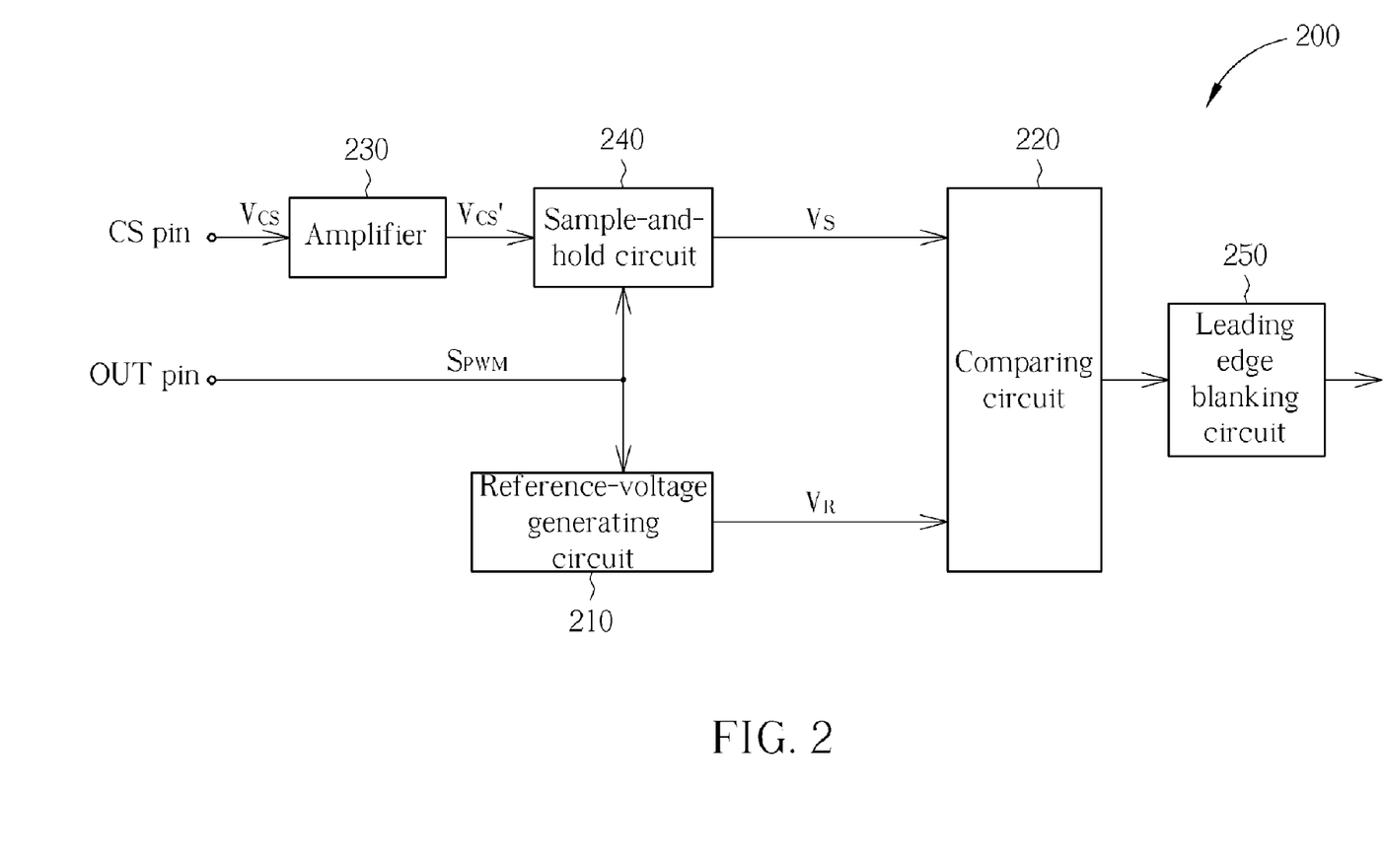
FIG. 2 is a diagram of a malfunction detecting circuit for detecting malfunction occurring to a current sensing resistor according to one exemplary embodiment of the present invention.
Figure 3:
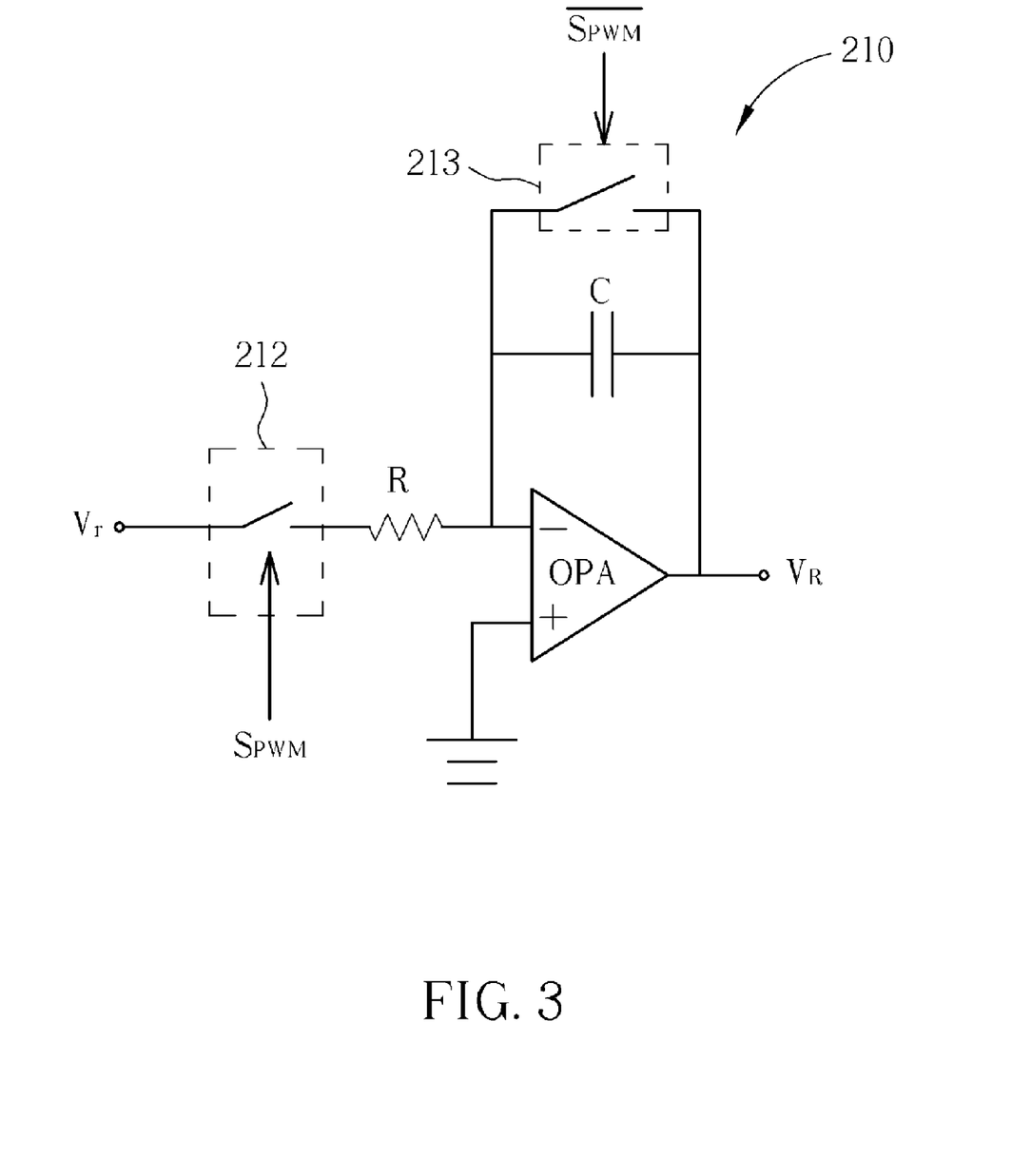
FIG. 3 is a diagram of a reference-voltage generating circuit of FIG. 2 according to one exemplary embodiment of the present invention.
Figure 4:
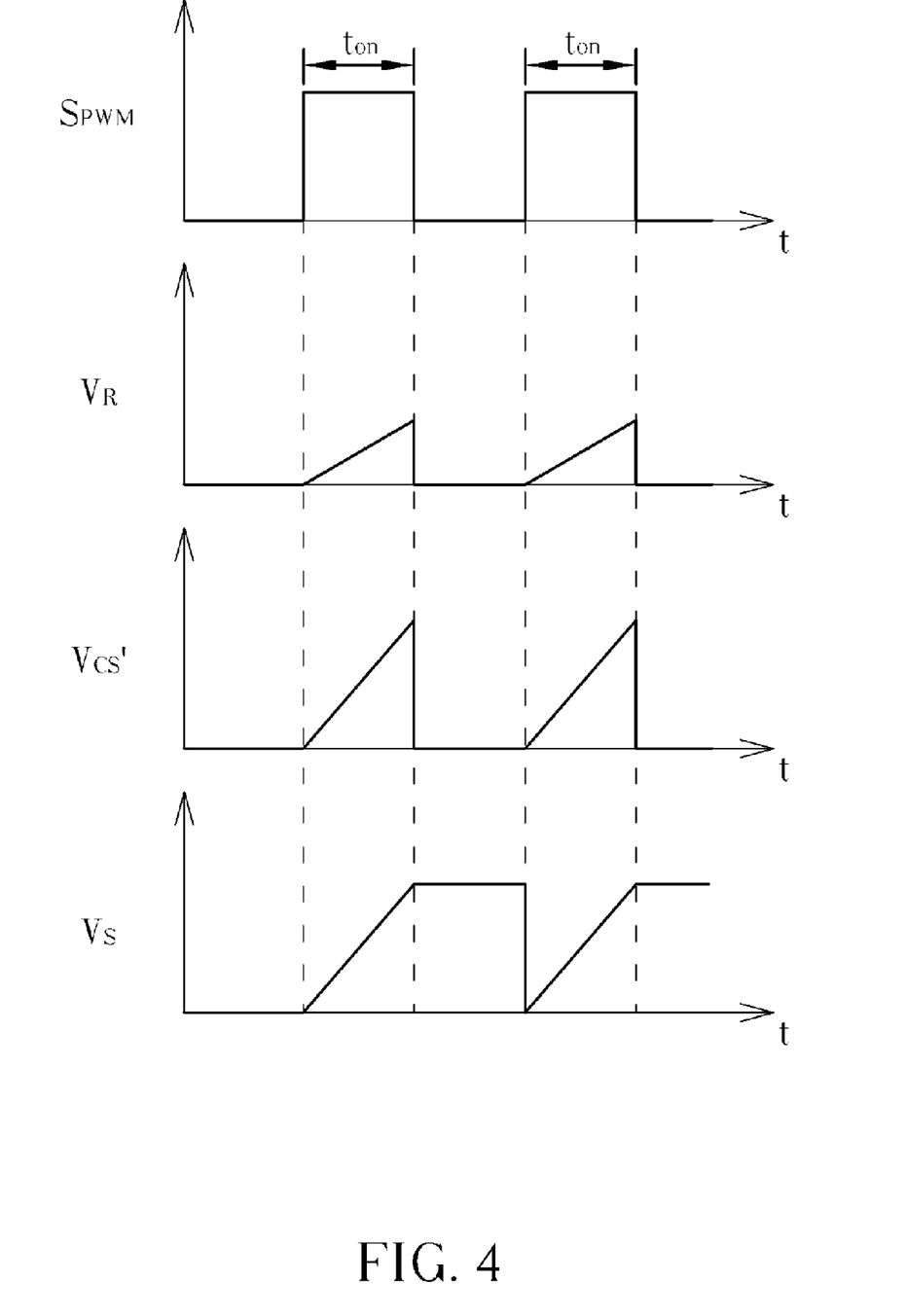
FIG. 4 is a diagram showing signal waveforms in the malfunction detecting circuit when no malfunction occurs to the current sensing resistor according to one exemplary embodiment of the present invention.

Please refer to FIG. 2, which is a diagram of a malfunction detecting circuit 200 utilized to detect malfunction occurring to a current sensing resistor such as the resistor RCS of FIG. 1 according to one exemplary embodiment of the present invention. The malfunction detecting circuit 200 utilizes a reference-voltage generating circuit 210 to generate a reference voltage signal $V_R$ varying with the on time period of a power switch (such as the power switch $Q_1$ in FIG. 1) in a power converting system; in addition, the malfunction detecting circuit 200 utilizes a comparing circuit 220 to compare the reference voltage signal $V_R$ with a sensing voltage signal $V_S$ corresponding to the current flowing through the current sensing resistor in order to generate a comparing result indicating whether the malfunction occurs. In one embodiment, the reference-voltage generating circuit 210, as shown in FIG. 3, comprises an integrator controlled by a PWM signal $S_{PWM}$ utilized to control the on time period of the power switch in the power converting system. The switch 212 in the reference-voltage generating circuit 210 is turned on synchronously with the turn-on of the power switch. Therefore, when the power switch is turned on, the integrator synchronously starts integrating a fixed voltage $V_r$. The switch 212 is off when the power switch is turned off, forming the reference voltage signal $V_R$ that varies with the on time period of the power switch, as shown in FIG. 4. The switch 213 shown in FIG. 3 is used for discharging, and further description is not detailed for brevity.

The sensing voltage signal $V_{CS}$ corresponds to the current flowing through the current sensing resistor; that is, it corresponds to the voltage signal detected by the current sensing (CS) pin. Because the voltage signal $V_{CS}$ detected by the CS pin is usually small in amplitude and not easy to be compared to the reference voltage signal, the malfunction detecting circuit 200 can further comprise an amplifier 230 coupled to the CS pin, as shown in FIG. 2, for amplifying the voltage $V_{CS}$ on the current sensing resistor in order to raise the signal-to-noise ratio (SNR), and increase the detecting accuracy. The output end of the amplifier 230 is coupled to a sample-and-hold circuit 240, and the sample-and-hold circuit 240 is used for sampling and keeping the peak value of the output signal $V_{CS}'$ of the amplifier 230 to generate a sensing voltage signal $V_S$; the waveform of the signal $V_S$ is shown in FIG. 4. Unlike the amplified signal $V_{CS}'$ that drops off rapidly when the power switch is turned off, the sensing voltage signal $V_S$ is maintained to the peak value and therefore is easier to be compared to the reference voltage signal $V_R$. In this embodiment, the sample-and-hold circuit 240 samples and holds the output signal $V_{CS}'$ of the amplifier 230 at the time when the power switch is turned off.

The noise level of the voltage signal $V_{CS}$ is decreased after the voltage signal $V_{CS}$ itself is processed by both the amplifier 230 and the sample-and-hold circuit 240. Therefore, the probability that the comparing circuit 220 mistakenly determines the comparing result between the voltage levels of the sensing voltage signal $V_S$ and the reference voltage signal $V_R$ can be decreased. The amplifier 230 and the sample-and-hold circuit 240, however, are not necessary elements of the present invention; other adjusting circuits that are able to raise the SNR or detecting accuracy can replace the amplifier 230 and/or the sample-and-hold circuit 240. Moreover, if the signal $V_{CS}$ detected by the current sensing resistor has good signal quality, the signal $V_{CS}$ can be directly utilized as the sensing voltage signal $V_S$ mentioned above, as long as the reference voltage signal $V_R$ has been properly designed.

Figure 5:
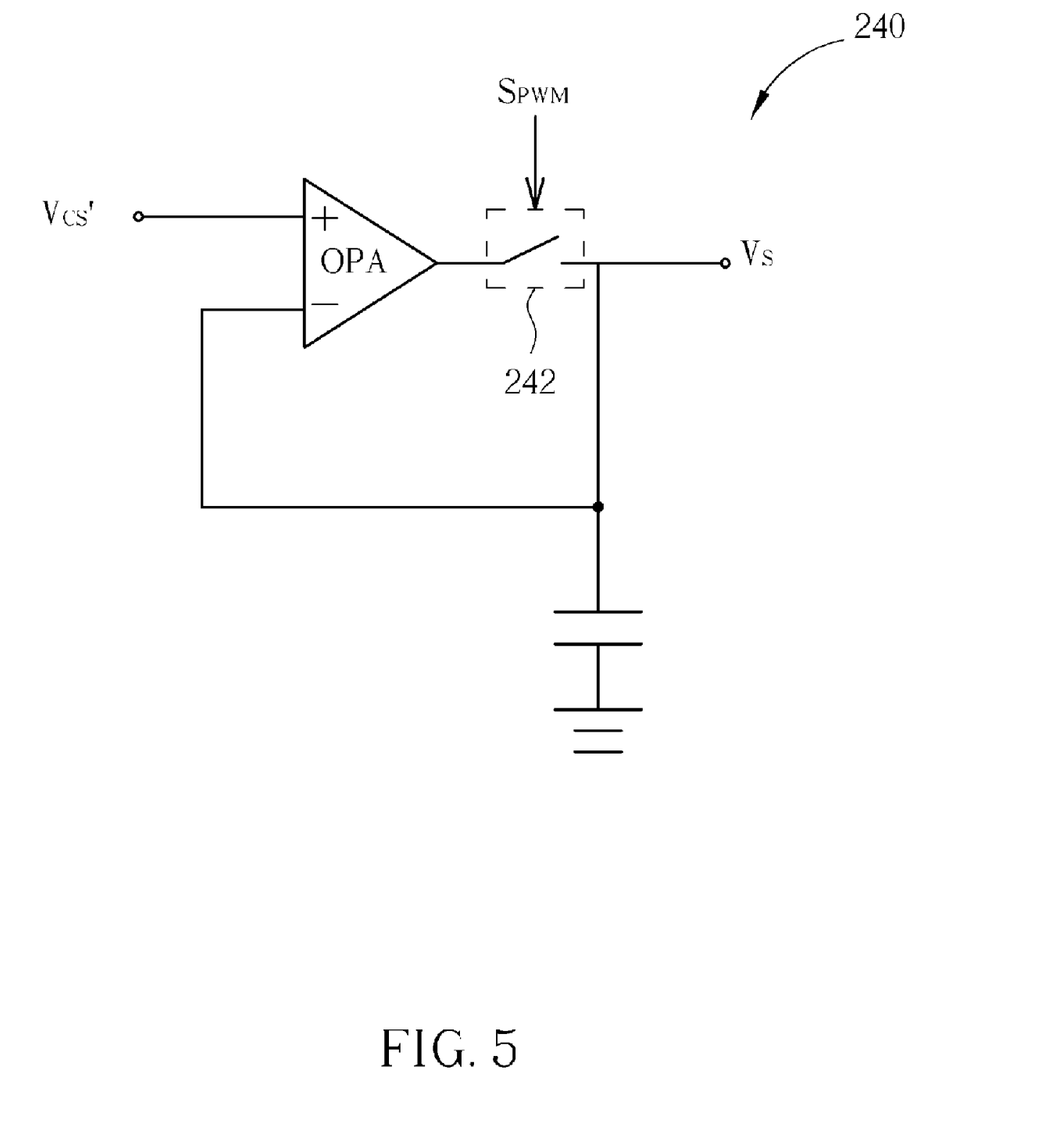
FIG. 5 is a diagram of a sample-and-hold circuit of FIG. 2 according to one exemplary embodiment of the present invention.

FIG. 5 shows an embodiment of the sample-and-hold circuit 240. As can be seen from the diagram, the sample-and-hold circuit 240 comprises an amplifier with an amplification factor equal to one, controlled by the PWM signal $S_{PWM}$ that controls the on time period of the power switch. When the power switch is on, the switch 242 in the sample-and-hold circuit 240 is turned on, therefore the sensing voltage signal $V_S$ outputted by the sample-and-hold circuit 240 is equal to the amplified signal $V_{CS}'$ at the input end; when the power switch is off, the PWM signal $S_{PWM}$ turns off the switch 242, therefore the sensing voltage signal $V_S$ can be maintained to the peak value of the voltage level outputted by the amplifier 230, until the power switch and the switch 242 are turned on again.

Referring to FIG. 4, it can be found that in this embodiment when there is no malfunction occurring, the slew rate of the reference voltage signal $V_R$ during the time period $t_{on}$ is designed to be smaller than that of the sensing voltage signal $V_S$. To achieve this objective, the values of the fixed voltage $V_r$ and the DC input signal $V_{in}$ satisfy the following relationship:

$$V_r/(R \times C) < (V_{in} \times R_S \times A)/L_P,$$

wherein A represents the amplification factor of the amplifier 230 (in FIG. 2), and R and C respectively stand for the resistance and capacitance of the resistor and capacitor in the integrator 210 (of FIG. 3). $R_S$ represents the resistance of the current sensing resistor such as $R_{CS}$ of FIG. 1. $V_{in}$ represents the DC input voltage, and $L_P$ the primary inductance of the transformer.

During every on time period, $t_{on}$, the comparing circuit 220 compares the sensing voltage signal $V_S$ with the reference voltage signal $V_R$ to determine whether the current sensing resistor malfunctions or not. In order to block the spike generated at the primary side of the transformer due to the suddenly turn-on of the power switch, the comparing circuit 220 can be further coupled to a leading edge blanking circuit 250 at the output end receiving $V_{CS}$. The leading edge blanking circuit 250 can blank the comparing result of the comparing circuit 220 during a short blanking time period starting at the conducting of the power switch, therefore the malfunction detecting circuit 220 only replies to the comparing result normally after the blanking time period passes. Since the transformer will not enter saturation as soon as the power switch becomes conductive during the blanking time period, a malfunction current sensing resistor will not result in over current to damage the power converting system during the blanking time period. After the blanking time period passes, the power converting system is protected by the enabling of the malfunction protection mechanism.

Figure 6:
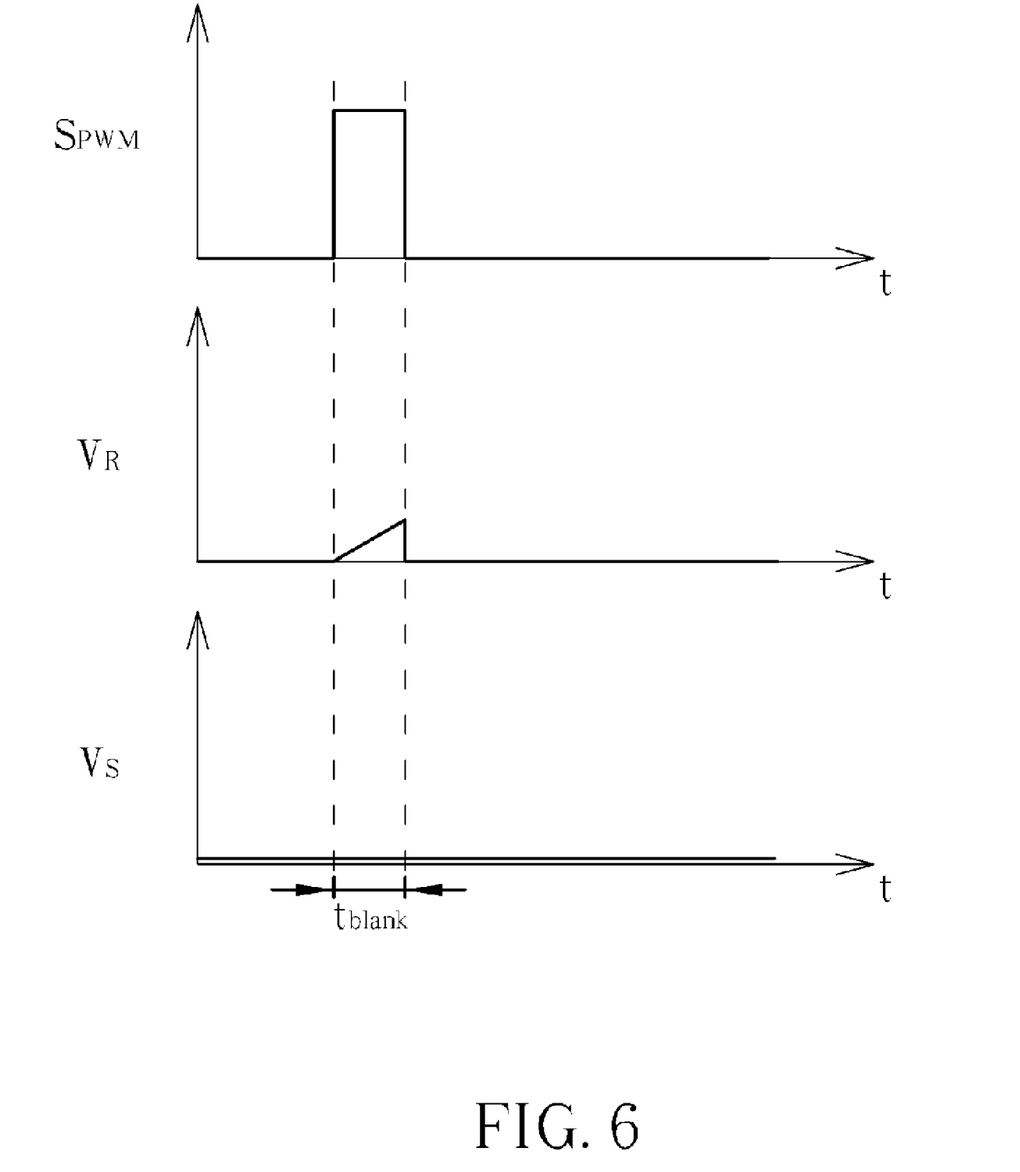
FIG. 6 is a diagram showing signal waveforms in the malfunction detecting circuit when malfunction occurs to the current sensing resistor according to one exemplary embodiment of the present invention.

Therefore, in the situation that the current sensing resistor is functionally normal, the sensing voltage signal $V_S$ will be more than or equal to the reference voltage signal $V_R$ generated by integrating the fixed voltage $V_r$. However, when the current sensing resistor is malfunctioning, having resistance so small that it almost shorts one terminal of the power switch such as $Q_1$ of FIG. 1 to ground, the sensing voltage signal $V_S$ may stay as low as a zero voltage level that is less than the reference voltage signal $V_R$ as shown in FIG. 6, wherein the $t_{blank}$ represents the blanking time period. Therefore, the malfunction is detected and determined as long as the comparing circuit 220 determines that the sensing voltage signal $V_S$ is less than the reference voltage signal $V_R$. After the blanking time period $t_{blank}$ passes, the comparing result of the comparing circuit 220 may trigger a malfunction protection mechanism; for example, triggering a flip-flop to control the PWM signal $S_{PWM}$ and reduce the on time period of the power switch by, for example, keeping the power switch turned off for a period of time longer than the off period during normal switching operation. For instance, the power switch is kept turned off for the following 10 normal switching cycles when the malfunction protection mechanism is triggered. The output voltage of the power converting system can be pulled down immediately, and the elements of the power converting system and the outer circuits coupled thereto can be protected from over current damage.

In one embodiment, the malfunction detecting circuit 200 can be integrated in the control chip 110 of the power converting system shown in FIG. 1 to assist or replace the conventional over voltage protection enabling mechanism adopted by the control chip 110. The output end of the leading edge blanking circuit 250 is coupled to the PWM circuit in the control chip 110. By properly designing the fixed voltage $V_r$ for the reference-voltage generating circuit 210, and thereby making the reference voltage signal $V_R$ have a specific relationship with the sensing voltage signal $V_S$ during normal operation, the malfunction detecting circuit 220 can immediately detect whether the malfunction occurs before the transformer saturates and the power converting system enters the protection mode, in which the power switch may be kept off for a longer period. Those skilled in the art should appreciate that, in addition to detecting whether the current sensing resistor is shorted to ground, the malfunction detecting circuit 200 can also be utilized to detect whether the sensing voltage signal $V_{CS}$ is abnormal due to the other factors.

Moreover, the trigger condition of the malfunction protection mechanism is adaptive to the system status because the reference voltage signal $V_R$ varies with the on time period $t_{on}$ of the power switch. The malfunction detecting circuit 200 is therefore more flexible and simpler than the malfunction detecting circuit that uses fixed over voltage protection threshold. For example, when the power converting system has a light load, the Vcs signal is usually small; however, the time period for the reference-voltage generating circuit 210 to integrate the fixed voltage $V_r$ is also short since the on time period $t_{on}$ of the power switch is short under the condition of light load, and the reference voltage signal $V_R$ generated by the reference-voltage generating circuit 210 is therefore still less than the sensing voltage signal $V_S$. As a result, the malfunction detecting circuit 200 can always correctly detect whether the malfunction of the current sensing resistor occurs.

To summarize, by utilizing a reference voltage signal varying with the conducting time period of a transformer as the determining basis of enabling an malfunction protection mechanism, embodiments of the present invention can detect the malfunction of a current sensing resistor in time so that a protection mode is enabled before the saturation of the transformer thereby preventing the elements such as the transistor or chip from damage. Embodiments of the present invention also have the advantages of simple circuit structure and easy implementation.

Those skilled in the art will readily observe that numerous modifications and alterations of the device and method may be made while retaining the teachings of the invention.

What is claimed is:

1. A malfunction detecting circuit for detecting malfunction occurring to a current sensing resistor, comprising:
    a reference-voltage generating circuit, for generating a reference voltage signal varying with an on time period of a power switch, wherein when the power switch is turned off, the reference voltage signal is zero; and
    a comparing circuit, for comparing a sensing voltage signal with the reference voltage signal to generate a comparing result indicating whether the malfunction occurs, wherein the sensing voltage signal corresponds to a current flowing through the current sensing resistor.

2. The malfunction detecting circuit of claim 1, wherein the comparing result indicates the malfunction occurs when the sensing voltage signal has signal amplitude smaller than the reference voltage signal.

3. The malfunction detecting circuit of claim 1, wherein the reference-voltage generating circuit comprises an integrator, for integrating a fixed voltage to generate the reference voltage signal when the power switch is on.

4. The malfunction detecting circuit of claim 3, wherein the integrator is controlled by a pulse width modulation (PWM) signal utilized to control the on time period of the power switch in a power converting system.

5. The malfunction detecting circuit of claim 3, wherein a start time point of the integrator is synchronized to a time point at which the power switch begins to be on.

6. The malfunction detecting circuit of claim 1, wherein the comparing circuit compares the sensing voltage signal to the reference voltage signal when the power switch is on.

7. The malfunction detecting circuit of claim 1, further comprising an amplifier, for amplifying a voltage detected by the current sensing resistor to generate the sensing voltage signal.

8. The malfunction detecting circuit of claim 1, further comprising a sample-and-hold circuit, for sampling and holding a peak value of a voltage detected by the current sensing resistor to generate the sensing voltage signal.

9. The malfunction detecting circuit of claim 8, wherein the sample-and-hold circuit is controlled by a pulse width modulation (PWM) signal utilized to control the on time period of the power switch in a power converting system.

10. The malfunction detecting circuit of claim 1, wherein the comparing result causes the power switch to be kept off when the malfunction occurs.

11. The malfunction detecting circuit of claim 1, further comprising a blanking circuit, for blanking the malfunction detecting circuit from enabling a malfunction protection mechanism during a blanking time period starting when the power switch is on.

12. A power converting system, comprising:
    a transformer comprising a primary winding; and
    a malfunction detecting circuit of claim 1, wherein the power switch is coupled to the primary winding of the transformer, and the current sensing resistor senses a current flowing through the primary winding.

13. The power converting system of claim 12, wherein the comparing result causes the power switch to be kept off when the malfunction occurs.

14. A method for detecting malfunction occurring to a current sensing resistor, comprising:
    generating a reference voltage signal varying with an on time period of a power switch, wherein when the power switch is turned off, the reference voltage signal is zero; and
    comparing a sensing voltage signal with the reference voltage signal to generate a comparing result, and determining whether the malfunction occurs according to the comparing result, wherein the sensing voltage signal corresponds to a current flowing through the current sensing resistor.

15. The method of claim 14, wherein the comparing result indicates the malfunction occurs when the sensing voltage signal has signal amplitude smaller than the reference voltage signal.

16. The method of claim 14, wherein the step of generating the reference voltage signal comprises integrating a fixed voltage to generate the reference voltage signal when the power switch is on.

17. The method of claim 16, wherein the step of integrating the fixed voltage is controlled by a pulse width modulation (PWM) signal utilized to control the on time period of the power switch in a power converting system.

18. The method of claim 14, wherein the step of generating the comparing result comprises comparing the sensing voltage signal with the reference voltage signal when the power switch is on.

19. The method of claim 14, wherein the comparing result causes the power switch to be kept off when the malfunction occurs.

20. The method of claim 14, wherein the step of comparing the sensing voltage signal to the reference voltage signal is performed after a blanking time period starting when the power switch is on.

* * * * *